US00RE45613E

(19) United States
(12) Reissued Patent
Hirahara et al.

(10) Patent Number: US RE45,613 E
(45) Date of Reissued Patent: Jul. 14, 2015

(54) ORGANIC TRANSISTOR HAVING A NON-PLANAR SEMICONDUCTOR-INSULATING LAYER INTERFACE

(71) Applicant: Tap Development Limited Liability Company, Wilmington, DE (US)

(72) Inventors: Edwin Hirahara, Federal Way, WA (US); David L. Lee, Tacoma, WA (US); Richard W. Bunce, Boise, ID (US)

(73) Assignee: Tap Development Limited Liability Company, Wilmington, DE (US)

(21) Appl. No.: 13/679,638

(22) Filed: Nov. 16, 2012

Related U.S. Patent Documents

Reissue of:
(64) Patent No.: 7,834,347
Issued: Nov. 16, 2010
Appl. No.: 12/165,907
Filed: Jul. 1, 2008

(51) Int. Cl.
*H01L 21/84* (2006.01)
*H01L 51/05* (2006.01)

(52) U.S. Cl.
CPC ..... *H01L 51/0541* (2013.01); *H01L 21/84* (2013.01); *H01L 51/0558* (2013.01)

(58) Field of Classification Search
USPC ..... 257/347–357, 57–61, E51.001; 438/99
See application file for complete search history.

(56) References Cited

U.S. PATENT DOCUMENTS

| | | | | |
|---|---|---|---|---|
| 4,994,401 | A * | 2/1991 | Ukai | 438/161 |
| 5,409,857 | A * | 4/1995 | Watanabe et al. | 438/158 |
| 5,936,259 | A * | 8/1999 | Katz et al. | 257/40 |
| 6,677,191 | B1 * | 1/2004 | Battersby | 438/161 |
| 6,716,664 | B2 * | 4/2004 | Machida et al. | 438/99 |
| 7,390,694 | B2 * | 6/2008 | Yamamoto | 438/99 |

* cited by examiner

*Primary Examiner* — Richard Booth
(74) *Attorney, Agent, or Firm* — Christensen O'Connor Johnson Kindness PLLC

(57) ABSTRACT

Organic transistors having a nonplanar interface between the insulating layer and the semiconductor layer are provided, along with methods for manufacturing.

26 Claims, 2 Drawing Sheets

ORGANIC TRANSISTOR HAVING A NON-PLANAR SEMICONDUCTOR-INSULATING LAYER INTERFACE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

Printed electronics may be viewed as an extension of the well-known printed circuit board technology. A printed circuit board includes a substrate with conductive metal paths for wiring. All other electronic components are made separately and are soldered or clamped to the substrate of the printed circuit board. In more recent developments, semiconductor integrated circuits are produced to perform most electronic circuit functions. Production of integrated circuits, however, requires the use of specialized semiconductor substrates and is expensive and impractical for producing ultra low-cost electronic devices. For example, typically, the cost of integrated circuits cannot be lowered significantly and even a relatively low level of cost cannot be achieved unless the integrated circuits are produced in a very high volume because of the very high cost of an integrated circuit fabrication line.

Printed electronics are formed by printing images layer by layer, i.e., by depositing one or more layers of material on a wide variety of substrates including uncoated or coated paper, laminated paper products, various plastic films such as polyethylene or polynaphthalene, etc. With printed electronics technology, it is possible to produce microelectric components of an electronic circuit. Some examples of microelectric components that may be produced include transistors, capacitors, resistors, diodes, and light emitting diodes, while examples of complete circuits include RFID tags, sensors, flexible displays, etc. As an example, a capacitor can be constructed by depositing a conducting area, followed by depositing a larger insulating layer and then another conducting area. This process can be repeated to obtain higher capacitance. As another example, an organic field-effect transistor (OFET) can be formed by depositing a conductor layer forming source and drain electrodes, a semiconductor layer, an insulating (dielectric) layer, and then another conductor layer forming a gate electrode.

Especially when low-cost conducting and semi-conducting materials, such as organic polymers, are used as the materials to be deposited, printed electronics forming complete functional circuits (e.g., RFID tags) may be produced at a very low cost on the order of about one-tenth of the cost of producing analogous integrated circuits. Such low-cost printed electronics are not expected to compete directly with silicon-based integrated circuits. Rather, printed electronics circuits may be produced to offer lower performance (e.g., lower frequency, lower power, or shorter lifetime) at much lower cost as compared to silicon-based integrated circuits.

Printed electronics components are made using a set of materials, typically five to seven different materials. These are usually liquids with dissolved and/or suspended polymers, polymer precursors, inorganic materials, and organic or inorganic additives, and are deposited in a wet printing process. Typical wet printing methods include letterpress printing, screen printing, and ink jet printing. Specifically, these materials are deposited in a desired sequence on a substrate and are often cured or activated by a thermal cycling and/or humidity treatment using a convection oven or by use of visible or invisible light, usually protecting the curing polymer in an inert atmosphere. This curing process drives off the solvents in the liquid polymer mix.

As described above, OFETs are devices that are compatible with manufacture by printing. OFET devices are known in the prior art, and one type of OFET, a top-gate OFET, will now be described. FIGS. 1 and 2 illustrate a top view (FIG. 1) and a side view (FIG. 2) of "traditional" organic field-effect transistors (OFET). Referring now to the prior art OFET shown in FIGS. 1 and 2, the OFET 100 is built on a foundation of a substrate 105 comprised of any material capable of supporting the following layers. Representative substrate materials include polymers, semiconductor and insulator wafers, and crystals. Upon the substrate 105, a source electrode 115 and a drain electrode 120 are patterned using techniques known to those of skill in the art (e.g., photolithography). The source 115 and drain 120 electrodes are typically metals, but can also be conducting organic materials. A semiconductor layer 110 having substantially planar upper and lower surfaces and uniform thickness, typically composed of a polymer or small molecule semiconductor, is deposited between the source electrode 115 and drain electrode 120. An insulating layer 125 of uniform thickness is deposited upon the source electrode 115, drain electrode 120, and semiconductor layer 110. Finally, a gate electrode 130 is deposited on the insulating layer 125 such that the gate electrode 130 is substantially aligned with the area of the semiconductor layer 110 (e.g., the gate electrode 130 spans the semiconductor layer 110 between the source electrode 115 and the drain electrode 120).

Charge carrier mobility is indicative of how well a charge can pass through the semiconductor in an OFET, and thus is one figure of merit that characterizes OFETs. Higher mobility is indicative of improved device performance. It has been reported that the channel semiconductor charge carrier mobility is partially dependent on the self-organization of the macromolecules in the semiconductor polymer as it makes the transition from liquid polymer layer to solid polymer. In addition to the material properties of the polymer itself, the factors that affect this self-organization are the temperature and cooling rate of the polymer during the curing process and the nature of the atmosphere around the polymer during curing. As is currently known, one method to produce a channel with high mobility utilizes a slow cooling rate to produce a solidified semiconductor polymer channel with higher structural order and, therefore, greater charge carrier mobility.

SUMMARY

Organic field effect transistors (OFET) are described herein and have improved characteristics through increasing its gate-channel capacitance by constructing the OFETs with a non-planar semiconductor layer resulting in a variable thickness for the dielectric insulating layer that separates the gate electrode and the organic semiconductor layer of the OFET. Additionally, examples of OFET devices described herein can be fabricated with an organic semiconductor layer deposited in two or more layers by depositing and curing successive layers of organic semiconductor before depositing an insulating layer and then the gate electrode. In addition to producing a non-planar semiconductor layer, these devices demonstrate improved mobility as a result of the self-organizing effects of multiple semiconductor-layer deposition steps.

In one aspect of the present invention, an organic transistor is provided. The organic transistor comprises a substrate; a source electrode and a drain electrode disposed on the substrate; a semiconductor layer of an organic material spanning between the source electrode and the drain electrode, the semiconductor layer having a protuberance on a top surface of the semiconductor layer; and an insulating layer disposed on the source electrode, drain electrode, and semiconductor layer, where the insulating layer includes at least a first thickness spanning the protuberance and a second thickness that is larger than the first thickness.

In another aspect of the present invention, an organic transistor is provided. The organic transistor comprises a source electrode and a drain electrode; a semiconductor layer of an organic material spanning between the source electrode and the drain electrode, the semiconductor layer having a first surface substantially adjacent to at least one of the source electrode and the drain electrode, and a second surface, wherein the second surface is a non-planar surface of the semiconductor layer; and an insulating layer substantially adjacent to the non-planar surface of the semiconductor layer, where the insulating layer has a non-planar surface at the interface of the non-planar surface of the semiconductor layer; and a gate electrode substantially adjacent to the insulating layer.

In another aspect of the present invention, a method for manufacturing an organic transistor is provided. The method comprises the steps of providing a substrate layer; layering the substrate with a source electrode and a drain electrode in a spaced-apart manner; providing an organic semiconductor layer between the source electrode and the drain electrode, where the semiconductor layer includes a non-planar surface to provide a channel having a greater charge-carrier mobility when compared to an organic transistor having a top surface substantially co-planar with a top surface of the source electrode and a top surface of the drain electrode; and curing the semiconductor layer.

DESCRIPTION OF THE DRAWINGS

The foregoing aspects and many of the attendant advantages of this invention will become more readily appreciated by reference to the following detailed description, when taken in conjunction with the accompanying drawings, wherein.

DETAILED DESCRIPTION

Examples of organic transistors having non-planar semiconductor layer surfaces are described herein, as well as methods for making such transistors. As will be described in more detail below, an uneven semiconductor layer surface in an organic transistor results in greater capacitance, improved self-organization at the semiconductor-insulating layer interface, and enhanced carrier mobility. Both "top-gate" (i.e., the gate electrode is the top layer of the transistor) and "bottom-gate" (i.e., the gate electrode is the bottom layer of the transistor) organic transistors are provided. As used herein, like numerals represent like elements throughout the figures.

Figure 3:
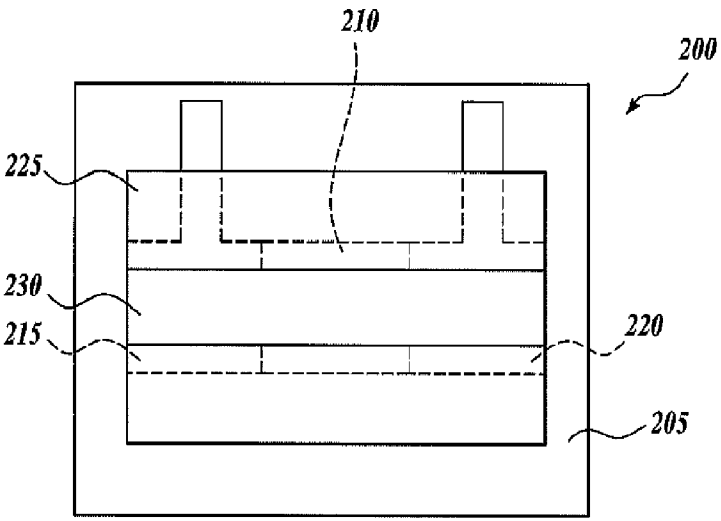
FIG. 3 is a schematic diagram showing the top view of an exemplary top-gate organic transistor formed in accordance with aspects of the invention.
Figure 4:
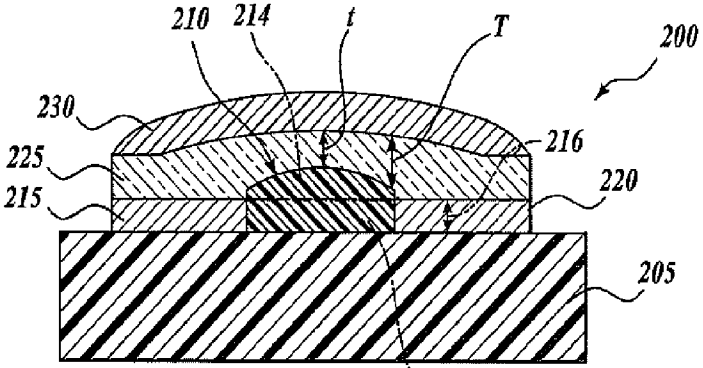
FIG. 4 is a side view of the exemplary organic transistor shown in FIG. 3.

Referring now to FIGS. 3 and 4, an exemplary embodiment of a top-gate organic transistor, generally designated 200 is shown. Referring to FIG. 3, the organic transistor 200 is comprised of a substrate 205; a source electrode 215; a drain electrode 220; a semiconductor layer 210 deposited between the source electrode 215 and the drain electrode 220; an insulating layer 225 deposited upon the source electrode 215, the drain electrode 220, and the semiconductor layer 210; and a gate electrode 230 deposited on the insulating layer 225. The gate electrode 230 is deposited on insulating layer 225 substantially aligned with the area of the semiconductor layer 210 where it is disposed between the source electrode 215 and the drain electrode 220 (e.g., the gate electrode 230 spans the semiconductor Layer 210 between the source electrode 215 and the drain electrode 220).

Figure 1:
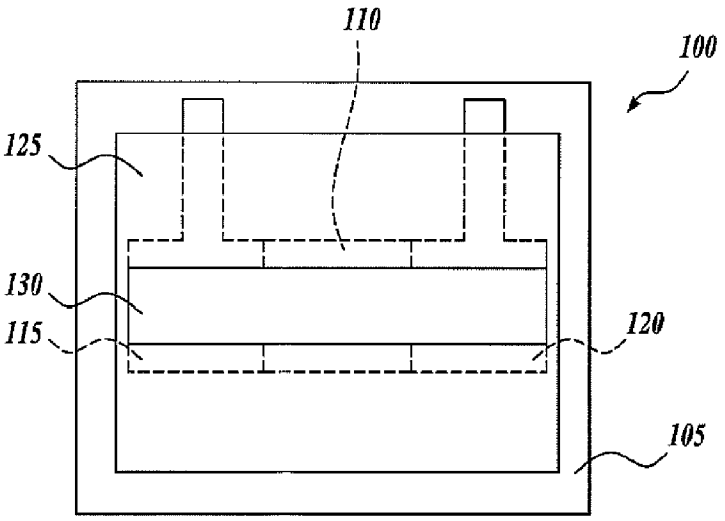
Fig.1. (PRIOR ART)
FIG. 1 is a schematic diagram showing the top view of a top-gate organic transistor fabricated according to prior art methods.
Figure 2:
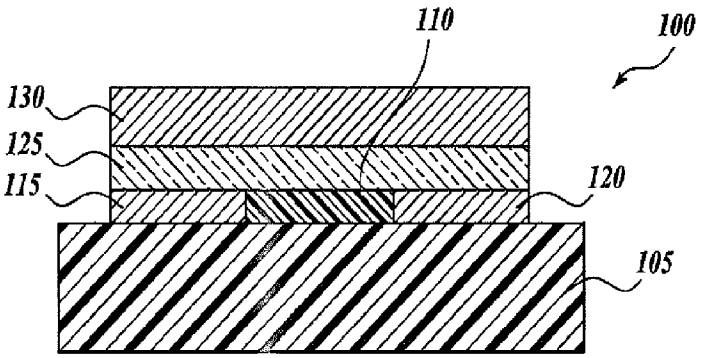
Fig.2. (PRIOR ART)
FIG. 2 is a side view of the organic transistor shown in FIG. 1.

The organic transistor 200 is distinct, in one respect, from the prior art in the shape of the semiconductor layer 210 and the resulting change in structure of the insulating layer 225 and gate electrode 230. To that end, a side view of the organic transistor 200, as shown in FIG. 4, depicts a non-planar (i.e., having a protuberance) semiconductor layer 210, distinct from the planar semiconductor layer 110 in the prior art device 100, shown in FIG. 2. It will be appreciated that this is only one non-limiting example of an OFET having a non-planar semiconductor layer 210. For example, the non-planar semiconductor layer 210 is shown as a dome, but can be any non-planar shape, including regular, non-regular, and asymmetric topographies. In one embodiment, the non-planar semiconductor layer 210 results in a non-planar insulating layer 225, distinct from the prior art, planar insulating layer 125. In a further embodiment, the non-planar insulating layer 225 results in a non-planar gate electrode 230, distinct from the prior art gate electrode 130. The advantages of such non-planar layers are described further below.

Figure 5:
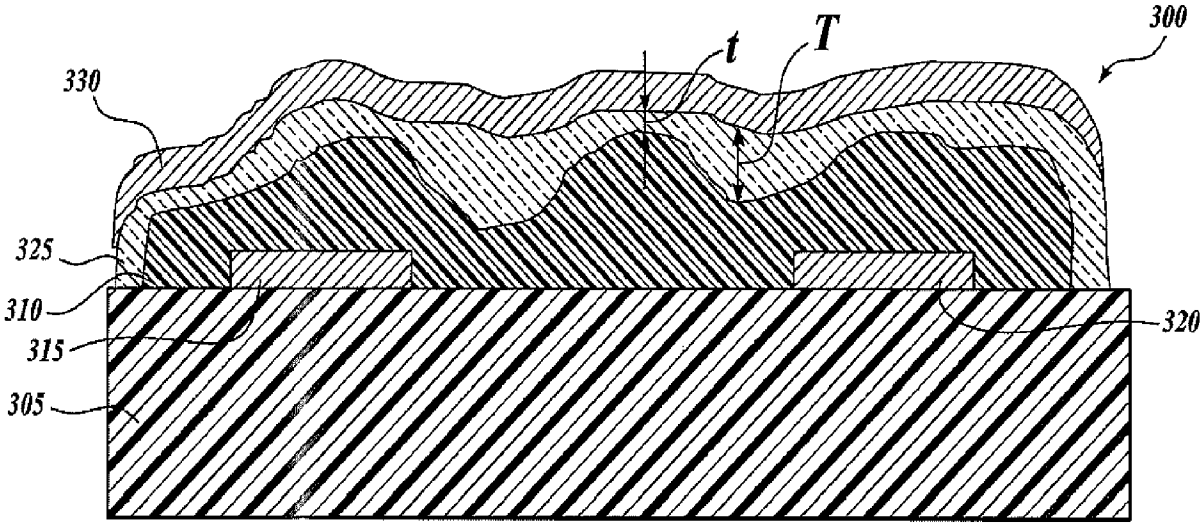
FIG. 5 is a cross-sectional sketch of an organic transistor in accordance with aspects of the invention.

FIG. 5 illustrates a side view of an alternative embodiment of an organic transistor 300 having a non-planar surface that includes a substrate 305, a source electrode 315, and a drain electrode 320. The semiconductor layer 310 has a varying surface that is distinctly non-planar. Subsequent depositions of an insulating layer 325 and a gate electrode layer 330 result in a non-planar stack of the layers of the device 300.

Figure 6:
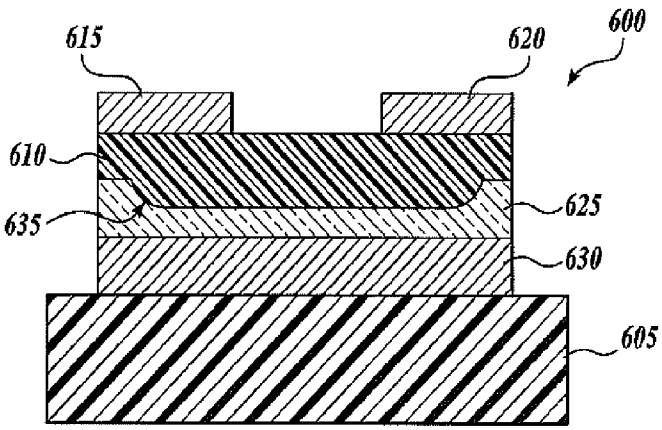
FIG. 6 is a side view of an exemplary bottom-gate organic transistor formed in accordance with aspects of the invention.

While top-gate OFETs have been described above and illustrated in FIGS. 1-5, it will be appreciated that bottom-gate OFETs are also improved through the use of a variable-thickness insulating layer and semiconductor layer. An exemplary bottom-gate OFET 600 is illustrated in FIG. 6 and comprises a gate electrode 630 deposited on a substrate 605; an insulating layer 625 deposited on the a gate electrode 630, and, in this exemplary embodiment, embossed such that the upper surface is non-planar; a semiconductor layer 610 deposited on the insulating layer 625 (upper surface); and a source electrode 615 and drain electrode 620 deposited on the semiconductor layer 610. The non-planar surface of the insulating layer 625 leads to a non-planar semiconductor layer 610 surface at the interface with the insulating layer 635. The non-planar insulating layer surface and non-planar semiconductor layer 610 surface improves performance of the device 600 as described above for top-gate OFETs, including through increased capacitance across the insulating layer 625 and the self-organization of the organic semiconductor in the semiconductor layer 610 at the insulating layer-semiconductor interface.

One mechanism by which the operation of organic transistors 200, 300, and 600 is improved is the non-planar surface of the semiconductor layer (e.g., 210) at the interface with the insulating layer (e.g., 225). The non-planar semiconductor layer typically results in variable thicknesses, designated t and T in FIGS. 4 and 5, of the insulating layer (e.g., 225) between the semiconductor layer (e.g., 210) and gate electrode (e.g., 230), respectively. Varying the thickness of the insulating layer (e.g., 225) produces increased capacitance and, thus, device performance.

Additionally, the organic transistors 200, 300, and 600 are improved because the area of the interface between the semiconductor layer (e.g., 210) and the respective insulating layer (e.g., 225) is increased due to its non-planar form, compared to the prior art device 100. The self-organization of the semiconductor layer (e.g., 210) at the interface of the insulating layer (e.g., 225), respectively, when curing, provides an enhanced organic transistor 200, 300, and 600 performance. A higher degree of ordering (e.g., molecular ordering), through self-organization in the semiconductor layer (e.g., 210), results in higher electron mobility in the devices 200, 300, and 600.

While any method for creating a non-planar semiconductor layer in forming organic transistors is contemplated to be within the scope of the present invention, two representative embodiments are described herein. In a first representative method, the semiconductor layer (e.g., 210) is deposited in two stages. Referring to FIG. 4, a first section 212 of the semiconductor layer 210 is deposited to provide a substantially planar semiconductor layer having a height 216 substantially equal to that of the source electrode 215 and drain electrode 220. Spin coating or inkjet printing are useful for depositing the first semiconductor section 212. After curing the first semiconductor section 212, a second section 214 is deposited on top of the first section 212 and cured, resulting in the non-planar semiconductor layer 210. In one embodiment, the resulting semiconductor layer 210 is dome-shaped, thereby creating a greater top surface area as compared to a channel fabricated with only one layer of semiconductor (e.g., semiconductor layer 212). To produce the dome-shaped semiconductor layer 210, a liquid-based deposition method such as inkjet printing is typically used. The use of slow (relative to a deposition technique such as spin-coating) evaporation of the organic semiconductor solvent produces a solid semiconductor layer shaped into a dome as a result of surface tension as the solvent evaporates.

A second representative example of a method for fabricating a non-planar semiconductor layer organic transistor includes intentionally deforming the semiconductor layer, e.g., 310, such that the surface becomes non-planar on a micro/nanoscopic scale. An example of a device fabricated using this second representative method is illustrated in FIG. 5, where the semiconductor layer 310 has peaks and valleys that result in variable thicknesses of the insulating layer 330 separating the semiconductor 310 and the gate electrode 325. Any means known to those of skill in the art can be used to selectively thin (or augment) the semiconductor 310, including embossing, nano-imprint lithography, etching, photolithography, molding, etc. Thinned regions of semiconductor layer 310 may be shapeless (i.e., randomly shaped by the fabrication process) or may be, for example, regions of circular or polygonal shapes embossed in regular or random patterns across the surface of the semiconductor layer 310.

It is also contemplated that thickness variations in the insulating layer 330 may be created by shaping the insulating layer 330, as opposed to the semiconductor layer 310. Shaping the insulating layer 330 may be accomplished using methods similar to those described for shaping the semiconductor layer 310, and also includes using particular coating and curing process parameters to deposit uneven layers.

Fabrication of organic transistors described herein can be carried out using techniques, generally known to those of skill in the art. A standard description of organic transistors and methods for making them can be found in U.S. Pat. No. 7,078,261, incorporated herein by reference in its entirety.

An exemplary fabrication process of top-gate organic transistors, as described herein, includes a structure produced in four layers. The fabrication begins with a substrate (e.g., 205). Representative substrate materials include polymers, such as polyethylene terephthalate (PET) and polymer-coated physical support materials (e.g., paper, cardboard, etc.); semiconductors, such as silicon; and inorganic materials. Upon the substrate are patterned source electrodes and drain electrodes (e.g., 215 and 220), with a channel intermediate the two electrodes. The source and drain electrodes (as well as the later-deposited gate electrode) are typically metals, such as gold, but can also be organic conductors, such as PEDOT:PSS. The source and drain electrodes can be patterned using lithographic techniques known to those of skill in the art, including photolithography, nano-imprint lithography, and soft lithography. Upon the source electrode and drain electrode, the semiconductor layer (e.g., 210) is deposited, spanning the channel between the two electrodes. The semiconductor is typically an organic material that may be a polymer, such as a polythiophene, or a small-molecule semiconductor, such as a polyacene (e.g., pentacene), and can be solvated in a suitable solvent for liquid-based deposition as a film. The organic semiconductor layer can be deposited, for example, using inkjet printing, spin coating, dip coating, drop coating, or vapor-based techniques. Typically, after deposition by a liquid-based technique, the organic semiconductor layer is cured using heat, typically in an inert environment, such as a vacuum oven or a nitrogen-filled oven. Curing can also be accomplished by ultraviolet light.

In a typical fabrication process, after the semiconductor layer has been cured, the height of the semiconductor layer (e.g., 216 in FIG. 4) is roughly equal to the height of the source electrode and drain electrode. Contrastingly, in one embodiment the organic transistor is fabricated using a second organic semiconductor deposition step, which creates a non-planar organic semiconductor surface. In one exemplary method for creating a non-planar surface, inkjet printing is used to apply a second layer to the organic semiconductor layer that has already been cured. The application of the second organic semiconductor layer results in, for example, a dome-shaped structure that has a greater height at the apex of the dome than on the sides of the dome. Such a dome-shaped structure is illustrated in the cross-sectional view of FIG. 4 (semiconductor layer 210 comprised of an upper semiconductor layer 214 deposited on a lower semiconductor layer 212). In a second exemplary method for creating a non-planar semiconductor upper surface, nano-imprint lithography is used to emboss shapes, such as squares or circles, in the semiconductor layer, resulting in periodic thinning of the semiconductor layer, where the shapes are embossed, and thickening of the semiconductor layer 210 where no embossing has occurred.

A dielectric layer (e.g., 225) is then deposited on the semiconductor layer 210 using an insulating layer, such as silicon dioxide, or organic insulators known to those of skill in the art. The insulating layer typically covers the semiconductor layer and the majority of the source and drain electrodes, at least to the extent that the source and drain electrodes are not allowed to contact the subsequently-deposited gate electrode (e.g., 230). In an exemplary embodiment, electrical contact to the source 215 and the drain 220 electrodes (and eventually the gate electrode 230) can be accomplished using electrical interconnects that lead away from the device 200. Exemplary electrical interconnects are not entirely covered by the insulating layer and, thus, are exposed for electrical contact (e.g., to a semiconductor parameter analyzer or other portions of an integrated circuit).

Finally, a gate electrode (e.g., 230) is deposited on top of the insulating layer 225 and patterned in such a way that it is aligned with at least a portion of the area above the semiconductor layer 210 that is disposed between the source electrode 215 and the drain electrode 220, so as to facilitate the field effect when the organic transistor 200 is operated. Although the gate electrodes 230 (FIGS. 3 and 4) and 330 (FIG. 5) are depicted as spanning almost the entire width of the organic transistors 200 and 300, respectively, it will be appreciated that the gate electrodes 230 and 330 can be much smaller than depicted (e.g., only large enough to produce a field effect). After completion of the basic OFET device 200 by fabrication of the gate electrode 230, the device may additionally be encapsulated so as to protect the deposited layers from moisture, oxygen, or other degrading conditions. Encapsulation can be accomplished using techniques known to those of skill in the art.

The fabrication of exemplary bottom-gate organic transistors (e.g., 600) proceeds, typically, in a reverse order of steps than those described above for top-gate transistors (e.g., 200). The layers can be deposited using similar techniques, and a typical bottom-gate transistor 600 is fabricated on a substrate 605, upon which is deposited a gate electrode 630. On the gate electrode 630 is deposited an insulating layer 625, upon which is deposited a semiconductor layer 630, with a non-planar interface 635 between the two layers 625 and 630. The non-planar interface 635 can be created, for example, by embossing or etching of the insulating layer 625, or the deposition of the insulating layer 625 in multiple stages, similar to the above-described multi-stage deposition method for the semiconductor layer 210 of top-gate organic transistors 200. The bottom-gate organic transistor 600 is completed by depositing a source electrode 615 and a drain electrode 620 upon the semiconductor layer 610.

The inventors of the present application believe the improved performance of organic transistors having non-planar semiconductor layers can be better understood using the following theoretical description.

Referring to FIG. 5, the following theoretical calculations take into consideration the size and thickness of the insulating layer 325, including thicknesses t and T.

The analysis begins by assuming a dielectric film 325 is printed over the non-planar semiconductor 310 and that this results, either naturally or intentionally by some means, in a non-uniform thickness for the insulating layer 325. Assuming that the capacitance-coupled gate semiconductor area A of the organic transistor is composed of just two regions—one having a thick insulating layer area T and one having a thin insulating layer t, both of equal area A/2. The actual measured capacitance can be expresses according to Equation (1).

$$C_a = \varepsilon * A\left[\frac{1}{(2*t)} + \frac{1}{(2*T)}\right] = \frac{1}{2} * \varepsilon * A\left[\frac{(t+T)}{t*T}\right] \tag{1}$$

The expected capacitance ($C_e$) can be calculated using the average insulating layer thickness ($t_{ave}$) according to Equations (2) and (3).

$$t_{ave} = \left(t + \frac{T}{2}\right) \tag{2}$$

$$C_e = \varepsilon * \frac{A}{t_{ave}} = 2 * \varepsilon * \frac{A}{(t+T)} \tag{3}$$

Then, by dividing the actual capacitance ($C_a$) by the expected capacitance ($C_e$), Equation (4) results:

$$\frac{C_a}{C_e} = \frac{[(t+T)2]}{(4*t*T)} \tag{4}$$

Alternatively, Equation (5) describes the situation where both the numerator and denominator in Equation (4) are divided by $T^2$, and substituting $C_{gain}$ for $C_a/C_e$, and x for t/T:

$$C_{gain} = \frac{(1+x)^2}{4x} = \frac{1}{4x} + \frac{1}{2} + \frac{x}{4} \tag{5}$$

If, in Equation (5), x=1 and t=T, Equation (6) results.

$$C_{gain} = \frac{C_a}{C_e} = 1 \tag{6}$$

In Equation (5), if $$x = \frac{1}{4} \text{ and } t = \frac{T}{4},$$

then Equation (7) results.

$$C_{gain} = \frac{C_a}{C_e} = \left(\frac{25}{16}\right) > 1 \tag{7}$$

If x in Equation 5 becomes very small (t<<T), for instance, if x=0.01, Equation (8) results.

$$C_{gain} = \frac{1}{4x} + \frac{1}{2} + \frac{x}{4} = 25 + 0.5 + 0.0025 = 25.5025 \tag{8}$$

As the preceding equations suggest, Equation (5) is greater than 1 in all cases where x>0. Additionally, it can be seen from the above equations that if there is a variation in the thickness of the insulating layer 325, then the actual capacitance ($C_a$) is always greater than the expected capacitance ($C_e$) based on an average thickness ($t_{ave}$) assumption.

While illustrative embodiments have been illustrated and described, it will be appreciated that various changes can be made therein without departing from the spirit and scope of the invention, as claimed.

The embodiments of the invention in which an exclusive property or privilege is claimed are defined as follows:

1. An organic transistor, comprising:

[(a)] a substrate;

[(b)] a source electrode and a drain electrode, each disposed on the substrate;

[(c)] a planar semiconductor layer of a first organic material spanning between the source electrode and the drain electrode [the];

[(d)] a non-planar semiconductor layer of a second organic material disposed on the planar semiconductor layer, the non-planar semiconductor layer having a protuberance on a top surface; and

[(e)] an insulating layer disposed on the source electrode, the drain electrode, and the protuberance on the top surface of the non planar semiconductor layer, wherein the insulating layer includes at least a first thickness spanning the protuberance and a second thickness that is larger than the first thickness.

2. The organic transistor of claim 1, further comprising a gate electrode disposed on the insulating layer.

3. The organic transistor of claim 2, wherein the source electrode, gate electrode, and drain electrode are each independently selected from the group consisting of a metal and a conductive polymer.

4. The organic transistor of claim 1, wherein the substrate is a polymer.

5. The organic transistor of claim 4, wherein the polymer is polyethylene terephthalate.

6. The organic transistor of claim 1, wherein the first organic material and the second organic material are independently selected from the group consisting of a thiophene polymer and a polyacene.

7. The organic transistor of claim 1, wherein the source electrode and the drain electrode each have a thickness, and wherein the combined planar and non-planar semiconductor layers have a thickness that is larger than the thicknesses of the source electrode and the drain electrode.

8. The organic transistor of claim 1, wherein the first organic material of the planar semiconductor layer and the second organic material of the non-planar semiconductor layer are the same.

9. The organic transistor of claim 1, wherein the non-planar semiconductor layer is dome-shaped.

*10. An organic transistor, comprising:*

*a source electrode and a drain electrode;*

*a planar semiconductor layer of a first organic material spanning between the source electrode and the drain electrode;*

*a non-planar semiconductor layer of a second organic material disposed on at least a portion of the planar semiconductor layer, wherein the non-planar semiconductor layer has a protuberance on a top surface; and*

*an insulating layer disposed on at least a portion of the source electrode, at least a portion of the drain electrode, and at least a portion of the protuberance, wherein the insulating layer includes at least a first thickness spanning the protuberance and a second thickness that is larger than the first thickness.*

*11. The organic transistor of claim 10, further comprising a gate electrode disposed on the insulating layer.*

*12. The organic transistor of claim 11, wherein the source electrode, gate electrode, and drain electrode are each independently selected from the group consisting of a metal and a conductive polymer.*

*13. The organic transistor of claim 10, further comprising a substrate on which the source electrode and the drain electrode are disposed.*

*14. The organic transistor of claim 10, wherein the first organic material and the second organic material are independently selected from the group consisting of a thiophene polymer and a polyacene.*

*15. The organic transistor of claim 10, wherein the source electrode and the drain electrode each have a thickness, and wherein the combined planar and non-planar semiconductor layers have a thickness that is larger than the thicknesses of the source electrode and the drain electrode.*

*16. The organic transistor of claim 10, wherein the first organic material and the second organic material are the same.*

*17. The organic transistor of claim 10, wherein the non-planar semiconductor layer is dome-shaped.*

*18. A method of manufacturing an organic transistor, the method comprising:*

*providing a source electrode and a drain electrode in a spaced-apart manner;*

*forming a planar semiconductor layer of a first organic material spanning between the source electrode and the drain electrode;*

*forming a non-planar semiconductor layer of a second organic material disposed on at least a portion of the planar semiconductor layer, wherein the non-planar semiconductor layer has a protuberance on a top surface; and*

*forming an insulating layer disposed on at least a portion of the source electrode, at least a portion of the drain electrode, and at least a portion of the protuberance, wherein the insulating layer includes at least a first thickness spanning the protuberance and a second thickness that is larger than the first thickness.*

*19. The method of claim 18, further comprising depositing a gate electrode on the insulating layer.*

*20. The method of claim 19, wherein the source electrode, gate electrode, and drain electrode are each independently selected from the group consisting of a metal and a conductive polymer.*

*21. The method of claim 18, further comprising providing a substrate, wherein said providing a source electrode and a drain electrode in a spaced-apart manner includes depositing the source electrode and the drain electrode on the substrate.*

*22. The method of claim 18, wherein the first organic material and the second organic material are independently selected from the group consisting of a thiophene polymer and a polyacene.*

*23. The method of claim 18, wherein the source electrode and the drain electrode each have a thickness, and wherein the combined planar and non-planar semiconductor layers have a thickness that is larger than the thicknesses of the source electrode and the drain electrode.*

*24. The method of claim 18, wherein the first organic material and the second organic material are the same.*

*25. The method of claim 18, wherein the non-planar semiconductor layer is dome-shaped.*

*26. An organic transistor, comprising:*

*a gate electrode, a source electrode, and a drain electrode;*

*a planar semiconductor layer of a first organic material spanning between the source electrode and the drain electrode;*

*a non-planar semiconductor layer of a second organic material abutting at least a portion of the planar semiconductor layer, wherein the non-planar semiconductor layer has a protuberance; and*

*an insulating layer disposed between the protuberance and the gate electrode, wherein the insulating layer includes at least a first thickness spanning the protuberance and a second thickness that is larger than the first thickness.*

* * * * *